United States Patent
Graff et al.

(10) Patent No.: US 8,895,325 B2
(45) Date of Patent: Nov. 25, 2014

(54) SYSTEM AND METHOD FOR ALIGNING SUBSTRATES FOR MULTIPLE IMPLANTS

(75) Inventors: John W. Graff, Swampscott, MA (US); Benjamin B. Riordon, Newburyport, MA (US); Nicholas P. T. Bateman, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 128 days.

(21) Appl. No.: 13/458,441

(22) Filed: Apr. 27, 2012

(65) Prior Publication Data

US 2013/0288400 A1 Oct. 31, 2013

(51) Int. Cl.
*H01L 21/00* (2006.01)
*B05C 11/00* (2006.01)

(52) U.S. Cl.
USPC ............. 438/14; 257/E21.53; 118/697

(58) Field of Classification Search
USPC ............. 438/14; 257/E21.53; 118/697
See application file for complete search history.

(56) References Cited

U.S. PATENT DOCUMENTS

| | | | |
|---|---|---|---|
| 6,589,336 B1 | 7/2003 | Ebara et al. | |
| 8,084,293 B2 | 12/2011 | Riordon et al. | |
| 2008/0011225 A1* | 1/2008 | McClure et al. | 118/244 |
| 2009/0308439 A1 | 12/2009 | Adibi et al. | |
| 2011/0162703 A1 | 7/2011 | Adibi et al. | |
| 2011/0198514 A1* | 8/2011 | Murphy et al. | 250/492.21 |
| 2011/0237022 A1 | 9/2011 | Bateman et al. | |
| 2012/0040490 A1 | 2/2012 | Gallazzo et al. | |

FOREIGN PATENT DOCUMENTS

| | | |
|---|---|---|
| DE | 102009018653 A1 | 9/2010 |
| EP | 0543361 A2 | 5/1993 |
| JP | 2007-281157 A | 10/2007 |

OTHER PUBLICATIONS

International Search Report and Written Opinion, mailed Jul. 4, 2013, for PCT/US2013/036311 filed Apr. 12, 2013.

* cited by examiner

*Primary Examiner* — Lex Malsawma

(57) ABSTRACT

A system and method are disclosed for aligning substrates during successive process steps, such as ion implantation steps, is disclosed. Implanted regions are created on a substrate. After implantation, an image is obtained of the implanted regions, and a fiducial is provided on the substrate in known relation to at least one of the implanted regions. A thermal anneal process is performed on the substrate such that the implanted regions are no longer visible but the fiducial remains visible. The position of the fiducial may be used in downstream process steps to properly align pattern masks over the implanted regions. The fiducial also may be applied to the substrate before any ion implanting of the substrate is performed. The position of the fiducial with respect to an edge or a corner of the substrate may be used for aligning during downstream process steps. Other embodiments are described and claimed.

17 Claims, 8 Drawing Sheets

SYSTEM AND METHOD FOR ALIGNING SUBSTRATES FOR MULTIPLE IMPLANTS

BACKGROUND OF THE INVENTION

1. Field of the Invention

Embodiments of the present disclosure relate to the field of substrate processing. More particularly, the present disclosure relates to an improved method and apparatus for aligning substrates for performing successive implanting operations, such as ion implanting operations.

2. Discussion of Related Art

Ion implantation is a standard technique for introducing conductivity-altering impurities into a workpiece such as a wafer or other substrate. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of devices that employ silicon workpieces. Any reduced cost in the manufacture or production of high-performance solar cells or any efficiency improvement to high-performance solar cells would have a positive impact on the implementation of solar cells which, in turn, would enhance the wider availability of this clean energy technology.

Solar cells are typically manufactured using the same processes used for other semiconductor devices, and they often use silicon as the substrate material. A semiconductor solar cell is a simple device having an in-built electric field that separates the charge carriers generated through the absorption of photons in the semiconductor material. This electric-field is typically created through the formation of a p-n junction (diode) which is created by differential doping of the semiconductor material. Doping a part of the semiconductor substrate with impurities of opposite polarity forms a p-n junction that may be used as a photovoltaic device converting light into electricity.

To form solar cells, patterned doping steps are often required. Such patterned structures are typically made using traditional lithography (or hard masks) and thermal diffusion. An alternative is to use implantation in conjunction with a traditional lithographic mask, which can then be removed easily before dopant activation. Yet another alternative is to use a shadow mask or stencil mask in the implanter to define the highly doped areas for the contacts. All of these techniques utilize a fixed masking layer, either positioned directly on the substrate or in the beamline.

All of these techniques have significant drawbacks. For example, they all suffer from limitations associated with the special handling of solar wafers, such as aligning the mask with the substrate and the cross contamination with materials that are dispersed from the mask during ion implantation.

Consequently, efforts have been made to reduce the cost and effort required to dope a pattern onto a substrate. While some efforts have been successful in reducing cost and processing time, often these savings come at the price of reduced pattern accuracy. In substrate patterning processes, however, the pattern masks must be very accurately aligned, since subsequent process steps rely on this accuracy.

Thus, there is a need for a reliable, reduced cost technique for producing solar cells where the number and complexity of the patterning process steps is reduced, while maintaining adequate accuracy so that masks are correctly positioned during subsequent process steps. While primarily directed to the production of solar cells, such techniques should also be applicable to other doping applications.

SUMMARY OF THE INVENTION

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Improved systems and methods are disclosed for processing substrates, such as for creating solar cells. Doped regions are created on a substrate. A fiducial marker may be created adjacent to at least one of the doped regions. Visual recognition of the fiducial marker may then be used to identify the exact regions that were implanted. This information can then be used in subsequent process steps to maintain or obtain alignment. Examples of subsequent process steps may include additional implantation steps, screen printing steps, metallization steps, laser processing steps, or other similar processes. Information about the alignment position may be fed backwards (e.g. to the implanter) or forwards (e.g., to other processing tools) to modify one or more of the process parameters. These techniques can also be used in other ion implanter applications.

The disclosed systems and methods of alignment of doping patterns may be used in fabricating solar cells using ion implantation. Ion implanted features may be visible following implantation due to changes in the material composition and structure. After a thermal annealing process employed to activate the implanted dopant species and to repair crystal damage, however, the implanted features may no longer be visible. Thus, a fiducial mark can be placed on the substrate to facilitate alignment of processing equipment during subsequent processing steps to ensure that the subsequent processes steps are directed to the same locations on the substrate as the prior implants.

A method is disclosed for processing a substrate. The method can include implanting ions into a substrate to create an implanted feature; determining a location of the implanted feature; adjusting a position of a mask to align with a fiducial to thereby align the mask with the implanted feature; and implanting ions through the mask into the substrate.

A method of processing a substrate is disclosed. The method can include implanting ions into a substrate to create an implanted feature; determining a location of the implanted feature; placing a fiducial onto the substrate at a known position with respect to the implanted feature; detecting a position of the fiducial at a subsequent processing step; and using the position of the fiducial to align with the implanted feature during the subsequent processing step.

An apparatus for implanting workpieces is disclosed. The apparatus may include an ion implanter for implanting ions into a substrate to create an implanted feature, a detector for detecting the location of a fiducial on the substrate, and a processor executing instructions for: determining the location of the fiducial; adjusting a position of a mask to align with the fiducial to thereby align the mask; and implanting ions through the mask into the substrate using the ion implanter.

A method of processing a substrate is disclosed, comprising: implanting ions into a substrate to create an optically visible implanted feature; thermal annealing the substrate, wherein the thermal annealing renders the implanted feature not optically visible, wherein a fiducial on the substrate is optically visible subsequent to the thermal annealing; adjusting a position of a mask to align with a fiducial to thereby align the mask with the implanted feature; and implanting ions through the mask into the substrate.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Figure 1:
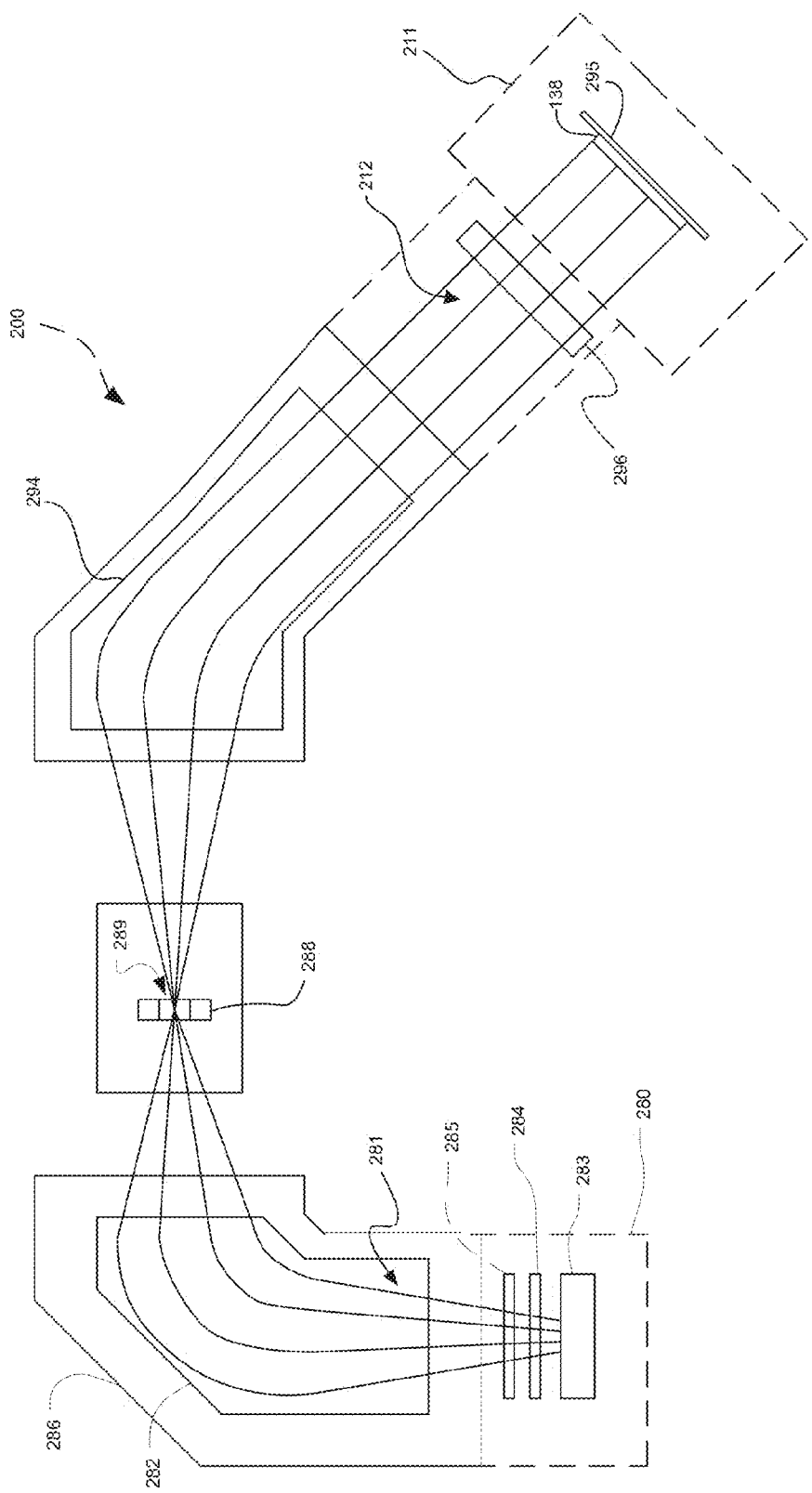
FIG. 1 is a block diagram of a beam-line ion implanter.

The disclosed systems and methods are described in connection with an ion implanter. While ion implantation of solar cells is specifically mentioned, the implanter can be used with other workpieces such as, for example, semiconductor wafers, flat panels, or light-emitting diodes (LEDs). Thus, the invention is not limited to the specific embodiments described below. FIG. 1 is a block diagram of a beam-line ion implanter 200. In one instance, this implanter 200 may be for doping a solar substrate. Those skilled in the art will recognize that the beam-line ion implanter 200 is only one of many examples of beam-line ion implanters that can produce ions. Thus, the systems and methods described herein are not limited solely to the beam-line ion implanter 200 of FIG. 1. In addition, it is understood that the ion implanter is not restricted to "beam-line" designs, and could include implanters based on plasma immersion, flood or other plasma source designs.

In general, the beam-line ion implanter 200 includes an ion source 280 to generate ions for forming an ion beam 281. The ion source 280 may include an ion chamber 283 where a feed gas supplied to the ion chamber 283 is ionized. This gas may be or may include or contain hydrogen, helium, other rare gases, oxygen, nitrogen, arsenic, boron, phosphorus, aluminum, indium, gallium, antimony, carborane, alkanes, another large molecular compound, or other p-type or n-type dopants. The generated ions may be extracted from the ion chamber 283 by a series of extraction electrodes to form ion beam 281. In particular, the ions may be extracted from chamber 283 by an extraction electrode part of which is formed by the exit aperture of chamber 283, suppression electrode 284 and ground electrode 285. The ion beam 281 is mass analyzed by mass analyzer 286 which includes a resolving magnet 282 and a masking electrode 288 having a resolving aperture 289. The resolving magnet 282 deflects ions in the ion beam 281 such that only ions having a desired mass to charge ratio associated with a particular dopant ion species pass through resolving aperture 289. The undesired ion species do not pass through the resolving aperture 289, since they are blocked by the masking electrode 288.

Ions of the desired ion species pass through resolving aperture 289 to the angle corrector magnet 294. The angle corrector magnet 294 deflects ions of the desired ion species and converts the ion beam from a diverging ion beam to ribbon ion beam 212, which has substantially parallel ion trajectories. The beam-line ion implanter 200 may further include acceleration and/or deceleration units in some embodiments. Acceleration and deceleration units are used in ion implant systems to speed up or slow down the ion beam. Speed adjustment is accomplished by applying specific combinations of voltage potentials to sets of electrodes disposed on opposite sides of the ion beam. As the ion beam passes between the electrodes, ion energies are increased or decreased depending on the applied voltage potentials. Since the depth of an ion implant is proportional to the energy of the impinging ion beam, beam acceleration may be desirable when performing deep ion implants. Conversely, where shallow ion implants are desired, beam deceleration is performed to ensure the impinging ions travel only a short distance into the workpiece. The illustrated embodiment includes a deceleration unit 296.

An end station 211 includes a platen 295 configured to support one or more workpieces, such as substrate 138, which is disposed in the path of ribbon ion beam 212, such that ions of the desired species are implanted into the substrate 138. The substrate 138 may be, for example, a semiconductor wafer, solar cell, etc. The end station 211 also may include a scanner (not shown) for moving the substrate 138 perpendicular to the long dimension of the ribbon ion beam 212 cross-section, thereby distributing ions over the entire surface of the substrate 138. Although a ribbon ion beam 212 is illustrated, other embodiments may provide a spot beam. It will be understood to those skilled in the art that the entire path traversed by the ion beam is evacuated during ion implantation. The beam-line ion implanter 200 may also include additional components known to those skilled in the art and may incorporate hot or cold implantation of ions in some embodiments.

The depth of ion implantation into the substrate 138 is based on the ion implant energy and ion mass. Smaller electronic device sizes require high beam current densities implanted at low energy levels (for example ≤2 keV). When the substrate 138 is a solar cell, the ribbon beam 212 may be implanted at a high beam current and at energies of approximately 1 to 10 keV. To accomplish this, process-chamber-deceleration (PCD) mode is used where the ion beam 281 and ribbon ion beam 212 are transported at relatively high energy through the beam-line ion implanter 200 and decelerated upstream from the end station 211 using the one or more deceleration units 296. For example, ribbon ion beam 212 may be transported through implanter 200 at energies of 30 keV to 50 keV prior to deceleration by deceleration unit 296.

For solar cells, the ribbon ion beam 212 is transported at maximum energy up to the deceleration unit 296 where the ions are decelerated to the desired energy just before end station 211. For example, the ribbon ion beam 212 may have an energy of 30 keV before deceleration unit 296 and 10 keV after the deceleration unit 296. This is referred to as a 3:1 deceleration ratio. Higher deceleration ratios of, e.g., 4:1 or even 50:1 may be possible depending on the desired implantation depth and the particular implant process.

As previously noted, a substrate may be subjected to a plurality of successive implanting steps in to produce a device such as a solar cell. Also as noted, and is important that the successive implants be precisely aligned in order to form the refined structures that are part of a typical solar cell. That is, it is important that subsequent implanted features be placed at particular locations with respect to the previously implanted features.

Figure 2:
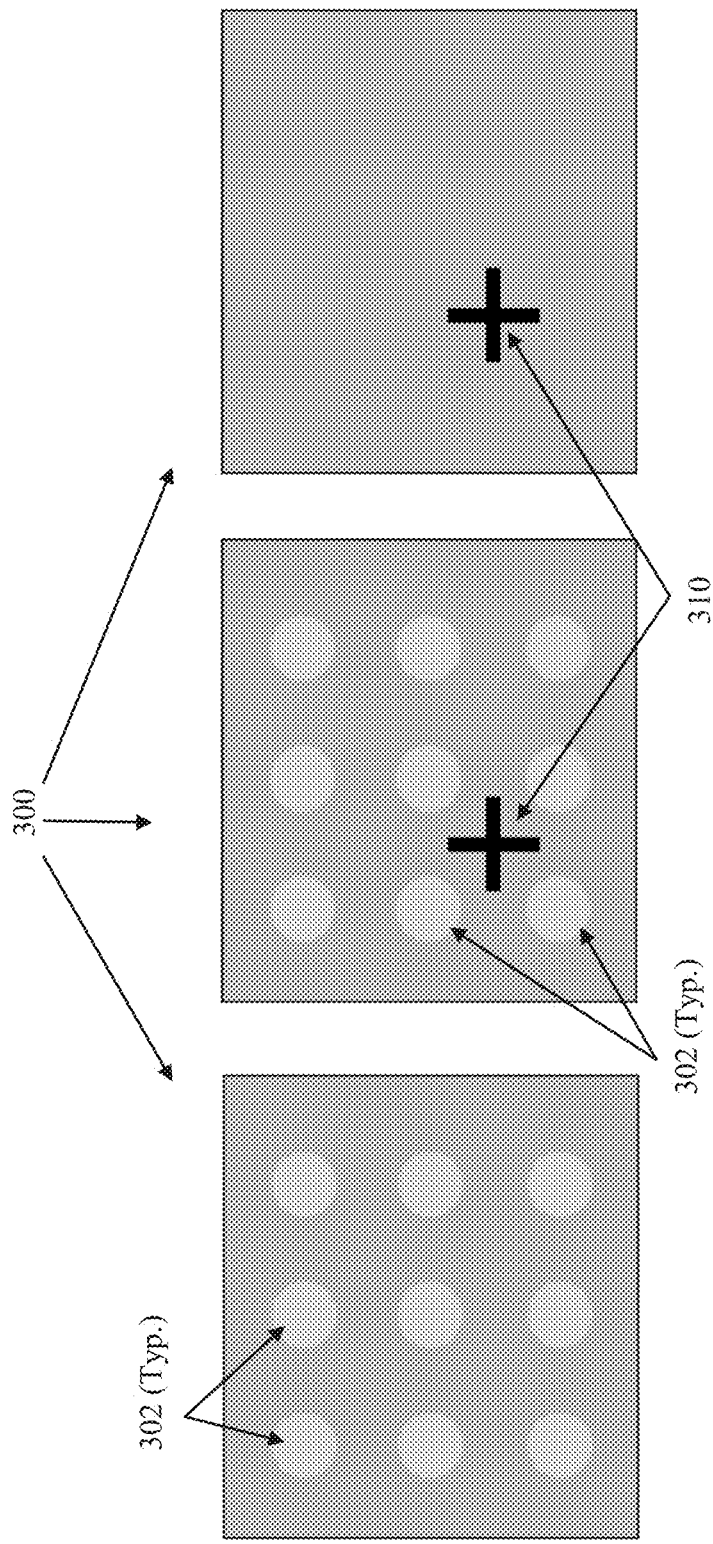
FIGS. 2A, 2B and 2C are first, second and third plan views of an exemplary substrate having a plurality of implant regions.
Figure 3:
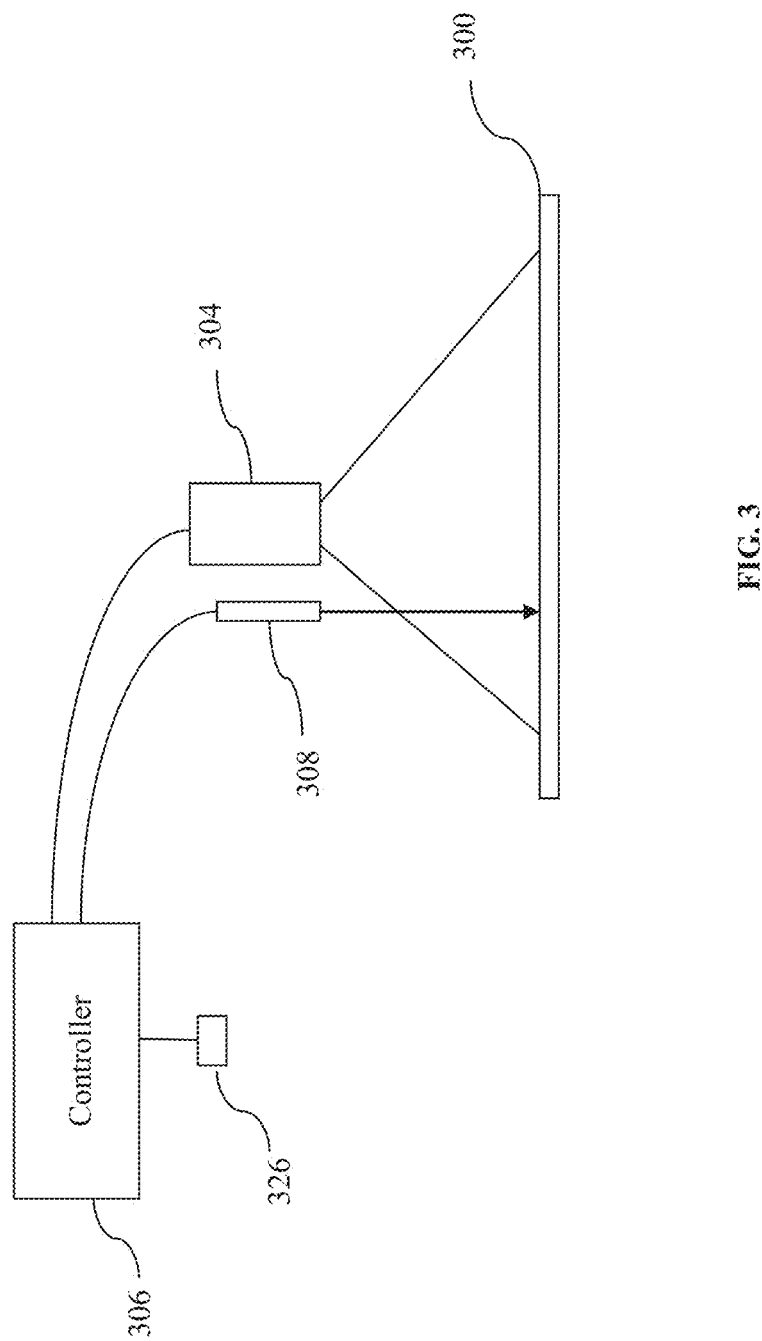
FIG. 3 is a schematic representation of a system for obtaining image information regarding implant regions and for creating a fiducial on a substrate.

Referring to FIGS. 2A-2C, an exemplary substrate 300, which may correspond with the substrate 138 in one instance, is shown at various steps during an overall implanting procedure. FIG. 2A shows the substrate 300 subsequent to a patterned ion implantation step. As can be seen, a plurality of implanted features 302 are visible following this ion implantation step due to changes that occur in the composition and structure of the substrate material caused by the ion impacts. A camera 304 (see FIG. 3) may be used to obtain an image of the pattern created by the implanted features 302. Image information may then be provided by the camera 304 to a controller 306. In one embodiment, the camera 304 is a charge coupled diode (CCD) camera. The camera 304 can also comprise a variety of other imaging devices, including an infrared camera, a photodiode, and a laser. A controller 306, in turn, may command a laser 308 to place a fiducial 310 on the substrate 300 at a known location with respect to one or more of the implanted features 302. Alternatively, the laser 308 may place the fiducial 310 onto the substrate 300 before the camera 304 obtains the image of the pattern created by the implanted features 302. In this alternative, the image information provided by the camera 304 to the controller 306 would include information about the position of the fiducial 310 and the positions of the implanted features 302. It will be appreciated that the fiducial 310 may be placed on the substrate 300 using any of a variety of techniques other than by laser. For example one or more fiducials 310 can be placed on the substrate 300 using inkjet techniques, a mechanical scribe, electrical discharge machining (EDM), etching, and the like. It will also be appreciated that the controller 306 may be part or the implanter 200 (FIG. 1), or it may be part of a separate process tool.

FIG. 2B shows the substrate 300 subsequent to placement of the fiducial 310. The illustrated fiducial 310 is shown as a cross-shape. It will be appreciated, however, that this is not critical, and the fiducial 310 can take any of a variety of forms such as a pattern of dots, or the like. In addition, although the fiducial 310 is described as being created by the laser 308, it could instead be created using any of a variety of other techniques, as desired.

Once the fiducial 310 is placed on (or in) the substrate 300, a thermal annealing process can be performed on the substrate. Thermal annealing is often used to "activate" an implanted dopant species and to repair crystal damage caused by the ion implant process. Such thermal annealing, however, renders the implanted features 302 to no longer be visible. This is shown in FIG. 2C. Unlike the implanted features 302, however, the fiducial 310 remains visible after the thermal anneal step. During later process steps, even though the implanted features 302 are no longer visible, alignment can be performed with respect to the fiducial 310, which, in turn, will guarantee alignment with the implanted features 302 even though they are not visible. For example, as part of a subsequent screen printing step, the camera 304 may be used to locate the position of the fiducial 310 and to provide this location information to the controller 306, which, in turn, may instruct appropriate adjustments to the position of a screen in order to obtain precise alignment with the implanted features 302.

Figure 4:
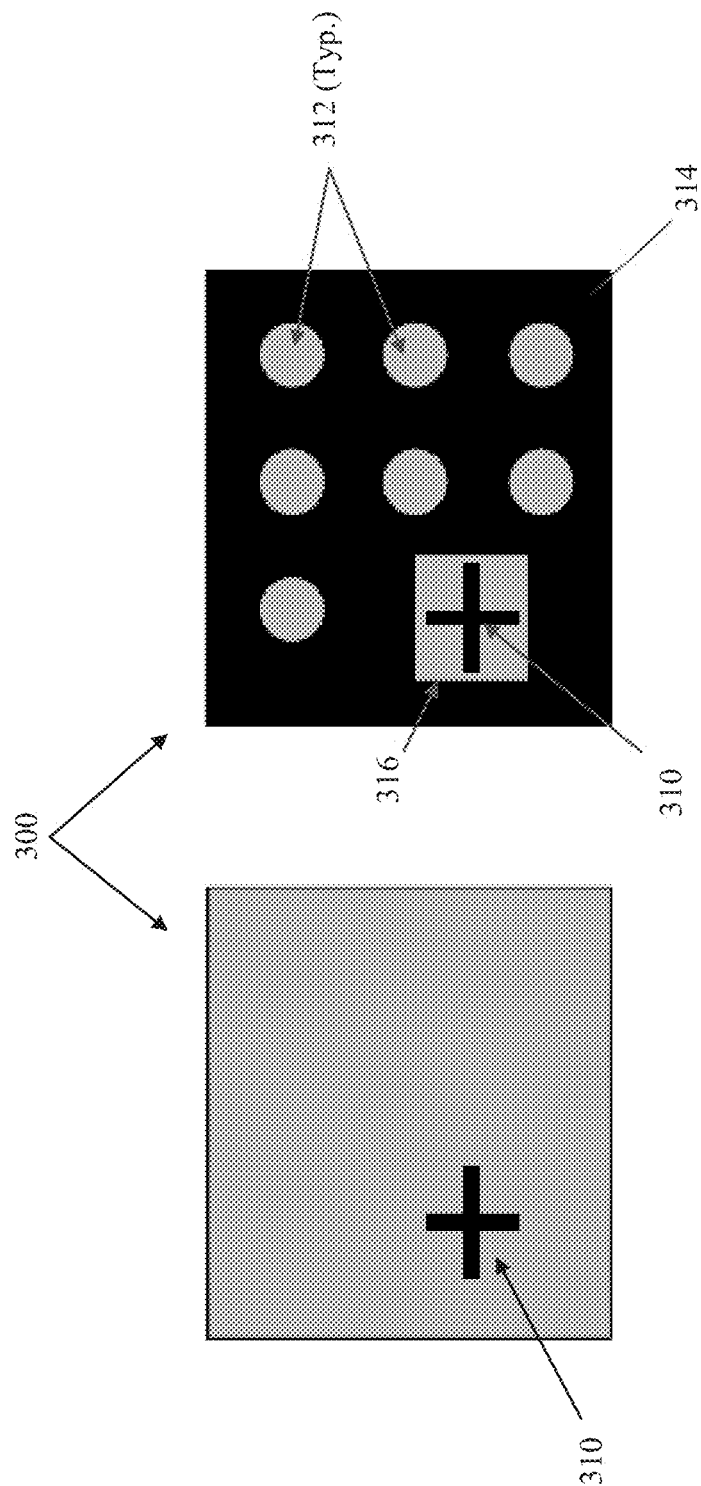
FIGS. 4A and 4B are first and second plan view of an exemplary substrate including a fiducial marker, and a plurality of implant sites.

FIG. 4A and 4B show an embodiment of the disclosed method in which a fiducial 310 is placed on a substrate 300 prior to any processing steps, or prior to a first patterned ion implantation step. In this embodiment a position of the fiducial 310 determined using the camera 304, and this information is provided to the controller 306. This positional information can then be used to align one or more masks in the implanter 200 to the substrate 300. FIG. 4A shows the substrate 300 prior to ion implantation. Fiducial 310 is shown. FIG. 4B shows the substrate 300, again prior to ion implantation, where the fiducial 310 and a plurality of pattern implant sites 312 are visible through a pattern mask 314. The pattern implant sites 312 correspond to the locations at which the implanted features 302 will be created during the ion implant step. One advantage of this technique is that it does not require precision alignment to the substrate edge. Rather, during the ion implantation step, the substrate 300 can be placed under the pattern mask 314, which can include an opening 316 through which a camera 304 can view the fiducial 310. This pattern mask 314 may be fabricated of graphite or silicon, for example, and may be placed a distance upstream from the substrate 300. Image information can be provided by the camera 304 to the controller 306, which can instruct movement of the pattern mask 314 to align the pattern mask 314 with the fiducial 310, thus achieving precise alignment with the resulting implanted features 302. In this manner, active feedback and alignment of the pattern mask 314 can be accomplished.

In an alternative, the camera 304 could be positioned at the last handling station prior to the substrate 300 entering the implanter 200. An image of the substrate 300 and fiducial 310 could be captured, calibrated for position, and the substrate 300 could be moved into implanter 200 where an ion implantation process can be performed to create implanted features 302.

Figure 5:
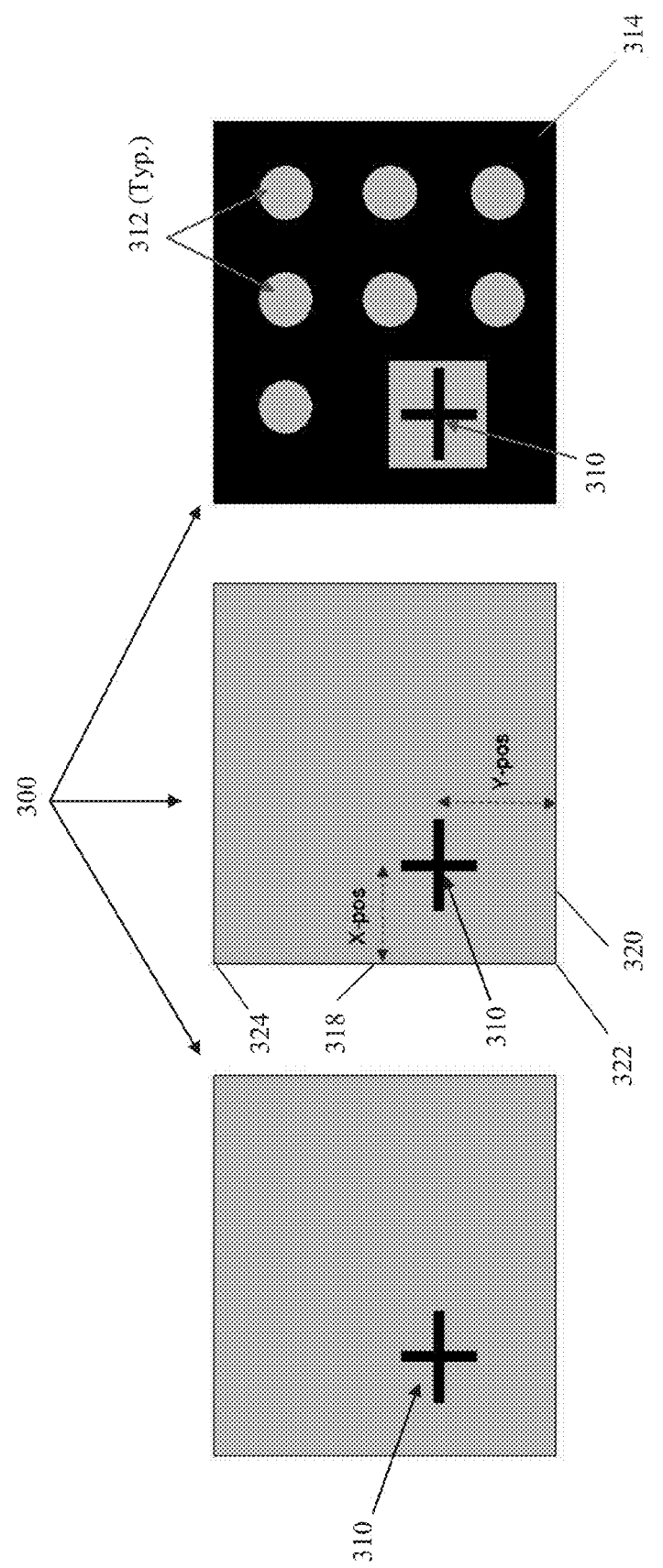
FIGS. 5A, 5B and 5C are first, second and third plan views of an exemplary substrate including a fiducial marker and a plurality of implant sites.

FIGS. 5A through 5C illustrate an embodiment of the disclosed method in which a fiducial 310 is placed on the substrate 300 prior to any processing steps, or at least prior to the first patterned ion implantation step (FIG. 5A). After placement of the fiducial 310, the position of the fiducial is measured with respect to the substrate edges 318, 320 and/or corners 322, 324 (FIG. 5B). Measurement may be performed with the same equipment used to detect the implant pattern as part of previously-described methods. For example, a camera 304, which may be a CCD camera in one instance, may be used to detect the fiducial 310. The edges 318, 320 of the substrate 300 are likewise relatively easy to observe via the camera 304. In some embodiments, back-lighting of the substrate 300 may be provided to aid in detection of the edges 318, 320. This image information is provided to the controller 306, which determines the relative positions of the edges and fiducial and stores the information in associated memory 326 so that during downstream patterning steps, the substrate 300 can again be observed using the camera 304, including the position of the fiducial 310 (FIG. 5C). Using the previously obtained measurement data regarding the position of the fiducial, the position of a pattern mask 314 can be adjusted with respect to the substrate edges 318, 320 and/or corners 322, 324 to precisely align the pattern mask 314 with implantation sites 312.

An advantage of this approach is that it does not require any type of edge registration. An additional advantage is that it allows measurement of the position of the fiducial offline (i.e., before the substrate is loaded into the implanter 200.) The position information may be provided to the controller 306, which can then instruct adjustment of the position of the pattern mask 314 with respect to the substrate 300 and with respect to the fiducial 310.

Included herein is a flow chart representative of an exemplary process for aligning substrates for performing successive implanting operations. While, for purposes of simplicity of explanation, the one or more processes shown herein, for example, in the form of a flow chart or logic flow are shown and described as a series of acts, it is to be understood and appreciated that the processes are not limited by the order of acts as some acts may, in accordance therewith, occur in a different order and/or concurrently with other acts from that shown and described herein. For example, those skilled in the art will understand and appreciate that a methodology could alternatively be represented as a series of interrelated steps. Moreover, not all steps illustrated in a methodology may be required for a novel implementation.

Figure 6:
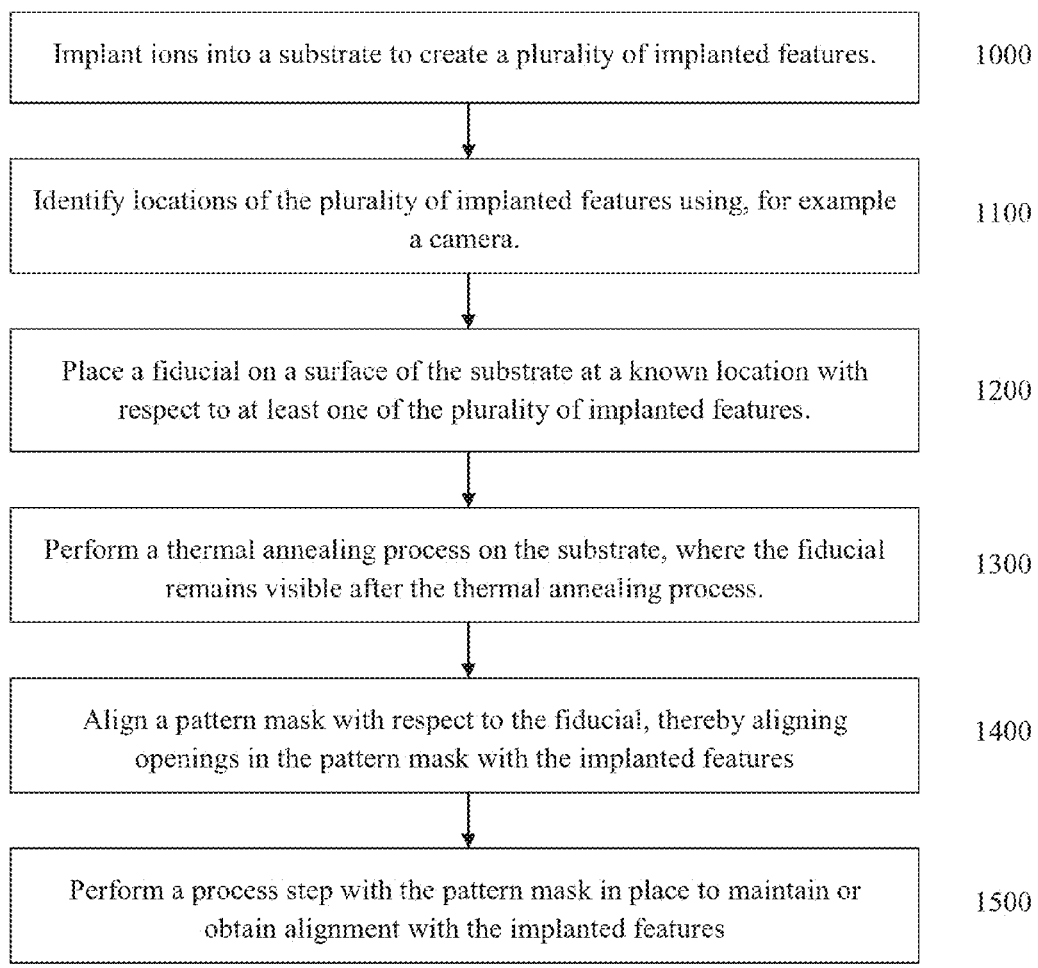
FIG. 6 is a flow chart illustrating a first exemplary method according to the disclosure.

A first exemplary logic flow will now be described in relation to FIG. 6. At step 1000 ions are implanted into a substrate to create a plurality of implanted features. At step 1100, locations of the plurality of implanted features are identified using, for example a camera. At step 1200, a fiducial is marked on a surface of the substrate at a known location with respect to at least one of the plurality of implanted features. At step 1300, a thermal annealing process is performed on the substrate, where the fiducial remains visible after the thermal annealing process. At step 1400, a pattern mask is aligned with respect to the fiducial, thereby aligning openings in the pattern mask with the implanted features created in step 1000. At step 1500, a subsequent process step (e.g., ion implant process) is performed with the pattern mask in place to obtain or maintain alignment with the implanted features. An embodiment such as this may be used, for example, to fabricate interdigitated back contact (IBC) solar cells that require both n-type and p-type doping, which may use two different pattern masks. In an alternate embodiment, the subsequent process step may be screen printing or a metallization process.

Figure 7:
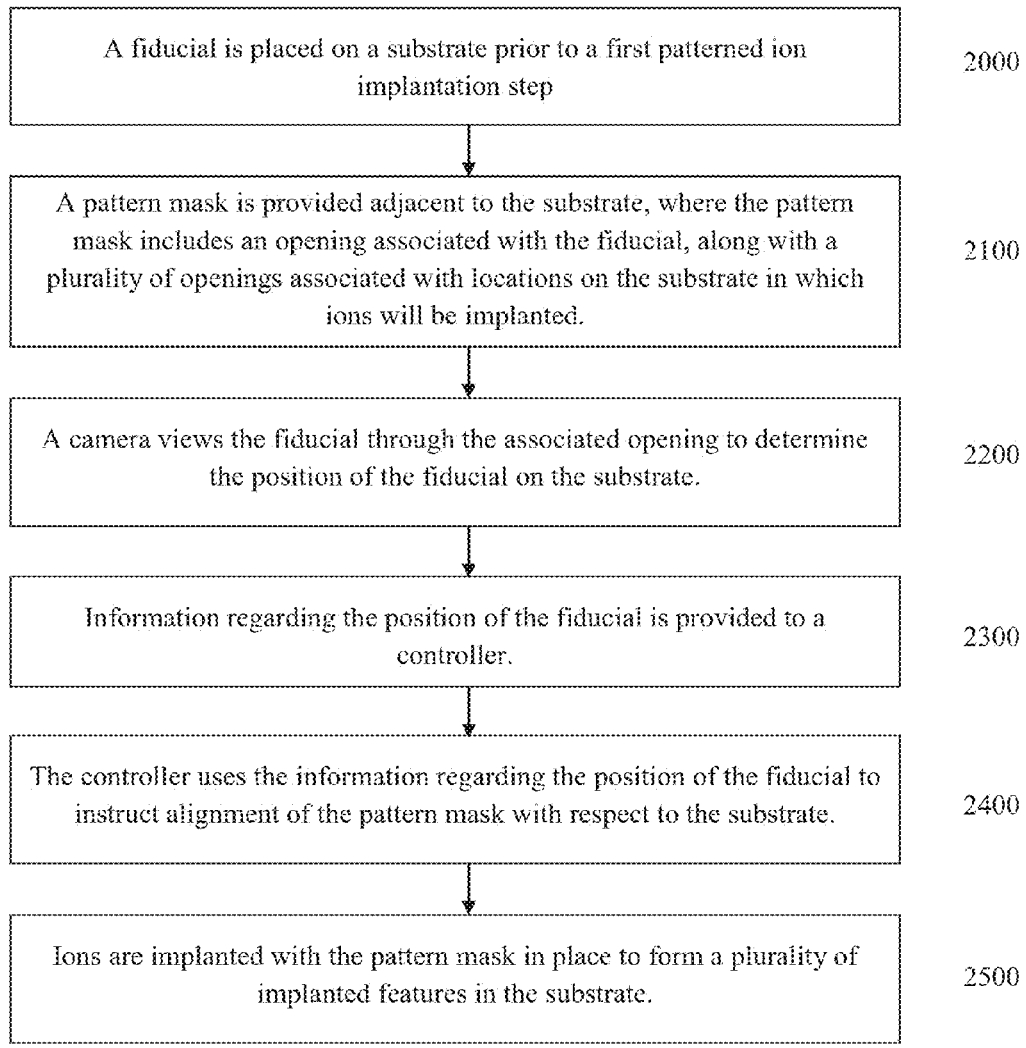
FIG. 7 is a flow chart illustrating a second exemplary method according to the disclosure.

A second exemplary logic flow will now be described in relation to FIG. 7. At step 2000, a fiducial is placed on a substrate prior to a first patterned ion implantation step. At step 2100, a pattern mask is provided adjacent to the substrate, where the pattern mask includes an opening associated with the fiducial, along with a plurality of openings associated with locations on the substrate in which ions will be implanted. At step 2200, a camera views the fiducial through the associated opening to determine the position of the fiducial on the substrate. At step 2300, information regarding the position of the fiducial is provided to a controller. At step 2400, the controller uses the information regarding the position of the fiducial to instruct alignment of the pattern mask with respect to the substrate. At step 2500, ions are implanted with the pattern mask in place to form a plurality of implanted features in the substrate. An embodiment such as this may be used in placing heavily-doped lines in a solar cell, such as a selective emitter (SE) solar cell. Accurate placement of the heavily-doped lines with respect to the fiducial will enable later screen printing or metallization steps using the fiducial to align with the heavily-doped lines.

Figure 8:
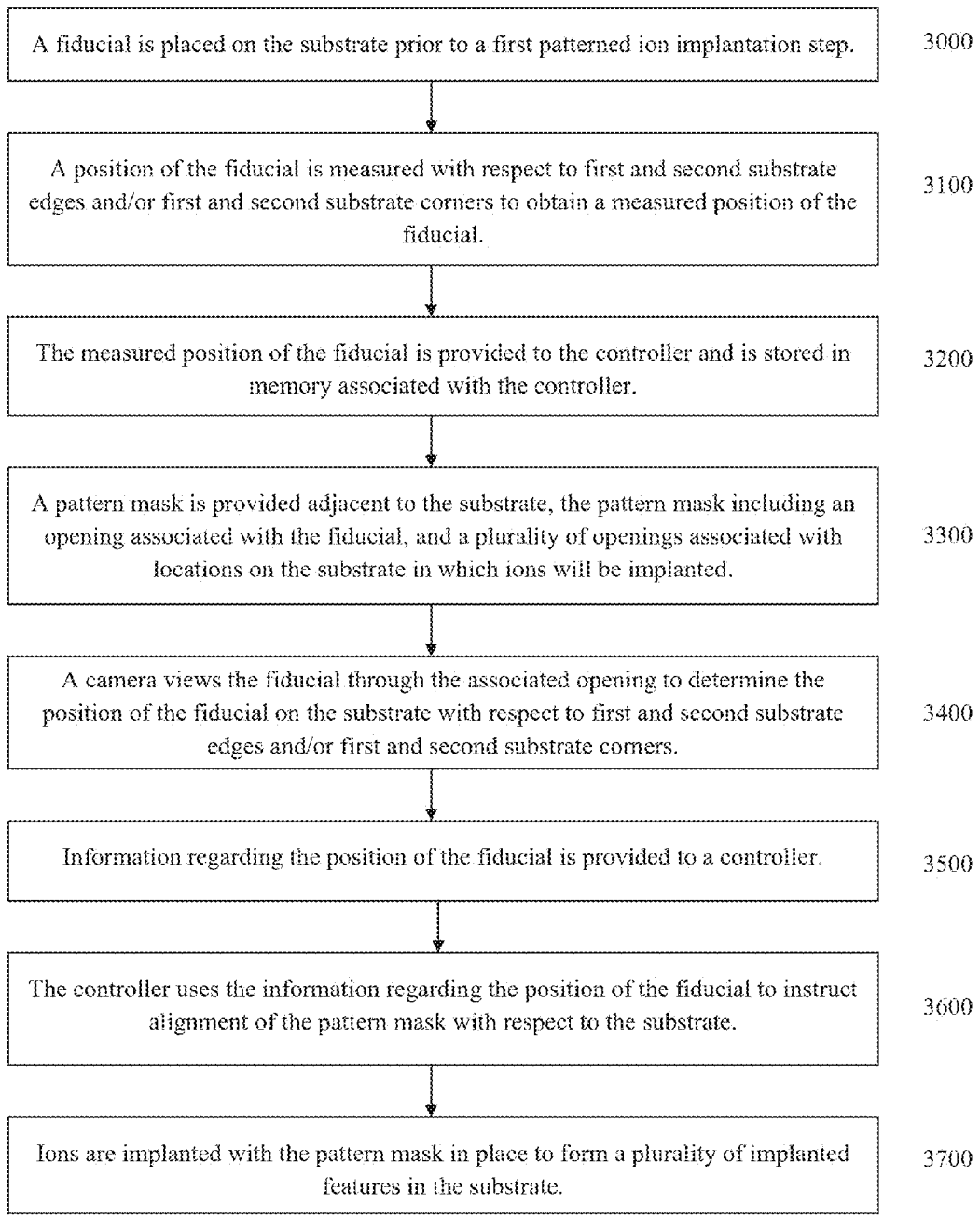
FIG. 8 is a flow chart illustrating a third exemplary method according to the disclosure.

A third exemplary logic flow will now be described in relation to FIG. 8. At step 3000, a fiducial is placed on the substrate prior to a first patterned ion implantation step. At step 3100, a position of the fiducial is measured with respect to first and second substrate edges and/or first and second substrate corners to obtain a measured position of the fiducial. At step 3200, the measured position of the fiducial is provided to the controller and is stored in memory associated with the controller. At step 3300, a pattern mask is provided adjacent to the substrate, where the pattern mask includes an opening associated with the fiducial, along with a plurality of openings associated with locations on the substrate in which ions will be implanted. At step 3400, a camera views the fiducial through the associated opening to determine the position of the fiducial on the substrate with respect to first and second substrate edges and/or first and second substrate corners. At step 3500, information regarding the position of the fiducial is provided to a controller. At step 3600, the controller uses the information regarding the position of the fiducial to instruct alignment of the pattern mask with respect to the substrate. At step 3700, ions are implanted with the pattern mask in place to form a plurality of implanted features in the substrate. The information regarding position of the fiducial with respect to first and second substrate edges and/or first and second substrate corners also may be used in downstream processes such as screen printing.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:
1. A method of processing a substrate, comprising:
   implanting ions into a substrate to create an implanted feature;
   determining a location of the implanted feature;
   placing a fiducial onto the substrate at a known position with respect to the implanted feature;

thermal annealing the substrate after implanting the ions into the substrate, wherein the implanted feature is optically visible prior to the thermal annealing and is not optically visible subsequent to the thermal annealing, and wherein the fiducial is optically visible subsequent to the thermal annealing;

detecting a position of the fiducial at a subsequent processing step; and using the position of the fiducial to align with the implanted feature during the subsequent processing step.

2. The method of claim 1, wherein determining the location of the implanted feature comprises detecting the fiducial.

3. The method of claim 2, wherein determining the location of the implanted feature comprises detecting the fiducial with at least one of a CCD camera, an infrared camera, a photodiode, and a laser.

4. The method of claim 1, further comprising adjusting a position of a mask to align with the fiducial using at least one of a CCD camera, an infrared camera, a photodiode, and a laser.

5. The method of claim 1, wherein the fiducial is placed on the substrate prior to implanting the ions into the substrate.

6. The method of claim 1, wherein the fiducial is placed on the substrate subsequent to implanting the ions into the substrate.

7. The method of claim 1, further comprising registering the fiducial to at least one of an edge or a corner of the substrate prior to implanting the ions into the substrate.

8. The method of claim 1, further comprising registering the fiducial to first and second adjacent edges of the substrate prior to implanting the ions into the substrate.

9. The method of claim 1, further comprising processing the substrate to produce a solar cell.

10. An apparatus for implanting workpieces comprising:
an ion implanter for implanting ions into a substrate to create an implanted feature, wherein the implanted feature is optically visible prior to a thermal annealing and is not optically visible subsequent to the thermal annealing;
a fiducial marking device for applying a fiducial to the substrate, wherein the fiducial marking device is configured to apply a fiducial that remains optically visible subsequent to the thermal annealing;
a detector for detecting the location of the fiducial on the substrate;
a processor executing instructions for:
determining the location of the fiducial;
adjusting a position of a mask to align with the fiducial to thereby align the mask; and
implanting ions through the mask into the substrate using the ion implanter.

11. The apparatus of claim 10, further comprising an actuator configured to translate the mask to align the mask with the fiducial.

12. The apparatus of claim 11, wherein the detector is selected from the list consisting of a CCD camera, an infrared camera, a photodiode, and a laser.

13. The apparatus of claim 10, wherein determining the location of the fiducial uses the detector.

14. The apparatus of claim 10, wherein in the fiducial marking device includes a laser.

15. A method of processing a substrate, comprising:
implanting ions into a substrate to create an optically visible implanted feature;
thermal annealing the substrate, wherein the thermal annealing renders the implanted feature not optically visible, wherein a fiducial on the substrate is optically visible subsequent to the thermal annealing;
adjusting a position of a mask to align with a fiducial to thereby align the mask with the implanted feature; and
implanting ions through the mask into the substrate.

16. The method of claim 15, comprising applying the fiducial to the substrate prior to thermal annealing the substrate.

17. The method of claim 15, comprising determining a distance from the fiducial to first and second adjacent edges of the substrate, and using the determined distance in the adjusting step.

* * * * *